United States Patent
Toh et al.

(10) Patent No.: US 7,880,658 B2
(45) Date of Patent: Feb. 1, 2011

(54) INTERPOLATION ACCURACY IMPROVEMENT IN MOTION ENCODER SYSTEMS, DEVICES AND METHODS

(75) Inventors: Kheng Hin Toh, Penang (MY); Gim Eng Chew, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/533,841

(22) Filed: Jul. 31, 2009

(65) Prior Publication Data
US 2010/0214139 A1   Aug. 26, 2010

Related U.S. Application Data

(63) Continuation-in-part of application No. 12/393,162, filed on Feb. 26, 2009.

(51) Int. Cl.
H03M 1/12   (2006.01)

(52) U.S. Cl. .......................... 341/158; 341/17; 341/111; 341/155; 341/156; 341/159

(58) Field of Classification Search .................... 341/17, 341/111, 156, 158, 159
See application file for complete search history.

(56) References Cited

U.S. PATENT DOCUMENTS

| | | | |
|---|---|---|---|
| 3,688,303 A * | 8/1972 | Metz | 341/116 |
| 4,364,045 A | 12/1982 | Spiegel | |
| 5,067,089 A * | 11/1991 | Ishii et al. | 702/126 |
| 5,126,742 A * | 6/1992 | Schmidt et al. | 341/156 |
| 5,367,202 A * | 11/1994 | Yee | 327/540 |
| 5,376,937 A * | 12/1994 | Colleran et al. | 341/159 |
| 5,519,398 A * | 5/1996 | Satoh et al. | 341/159 |
| 5,706,219 A | 1/1998 | Ishimoto | |
| 5,907,298 A | 5/1999 | Kiriyama et al. | |
| 5,920,494 A | 7/1999 | Setbacken et al. | |
| 6,355,927 B1 | 3/2002 | Snyder | |
| 6,424,274 B1 * | 7/2002 | Schnizlein et al. | 341/26 |
| 6,570,522 B1 * | 5/2003 | Galambos et al. | 341/155 |
| 6,928,386 B2 | 8/2005 | Hasser | |
| 7,049,857 B2 | 5/2006 | Styduhar | |
| 7,075,465 B2 * | 7/2006 | Jonsson et al. | 341/120 |
| 7,180,430 B2 | 2/2007 | Ng et al. | |
| 2002/0196172 A1 | 12/2002 | Bult | |
| 2004/0061044 A1 | 4/2004 | Soar | |
| 2005/0208923 A1 * | 9/2005 | Khorram | 455/336 |
| 2006/0071832 A1 * | 4/2006 | Regev | 341/143 |
| 2006/0290554 A1 * | 12/2006 | Ishii | 341/155 |
| 2008/0030239 A1 | 2/2008 | Sullivan et al. | |
| 2008/0231326 A1 | 9/2008 | Rai et al. | |
| 2008/0272715 A1 | 11/2008 | Moller et al. | |

OTHER PUBLICATIONS

"An innovative method to increase the resolution of optical encoders in motion servo systems," Cheung, N.C., Power Electronics and Drive Systems, 1999. PEDS apos; 99. Proceedings of the IEEE 1999 International Conference, vol. 2, 1999, pp. 797-802.

* cited by examiner

Primary Examiner—Linh V Nguyen

(57) ABSTRACT

Disclosed are various embodiments of interpolation circuits for use in conjunction with optical encoders. The analog output signals provided by incremental or absolute motion encoders are provided to an interpolation circuit, which is capable of providing high interpolation factor output signals having high timing accuracy. The disclosed interpolation circuits may be implemented using CMOS or BiCMOS processes without undue effort.

49 Claims, 14 Drawing Sheets

INTERPOLATION ACCURACY IMPROVEMENT IN MOTION ENCODER SYSTEMS, DEVICES AND METHODS

RELATED APPLICATIONS

This application is a continuation-in-part of U.S. patent application Ser. No. 12/393,162 filed Feb. 26, 2009 entitled "Interpolation Accuracy Improvement in Motion Encoder Systems, Devices and Methods" to Mei Yee Ng et al., the entirety of which is hereby incorporated by reference herein.

FIELD OF THE INVENTION

Various embodiments of the inventions described herein relate to the field of motion encoders, and interpolation circuitry, components, devices, systems and methods associated therewith.

BACKGROUND

Interpolation circuitry is commonly employed in incremental and absolute digital motion encoding systems, where the interpolation circuitry is configured to generate digital pulses having higher frequencies than base sinusoidal analog signals input to the circuitry. As the interpolation factor of the circuitry increases, the accuracy of the interpolation circuitry becomes ever more critical since the output provided by such circuitry ultimately determines the accuracy of the encoding system. Unfortunately, due to the architecture of most interpolation circuitry—which typically relies on a large number of comparators—the outputs provided by interpolation circuitry tend to be noisy and contain undesired noise spikes arising from excessive switching in the comparators. As a result, the comparators employed in interpolation circuitry for motion encoders typically employ a significant amount of hysteresis to provide immunity from noise spikes. Such hysteresis itself becomes a source of inaccuracy for the interpolation circuitry, however, especially at high interpolation factors.

Referring to FIG. 1, there is shown an optical encoder system 10 of the prior art comprising light emitter 20 (typically an LED), code wheel or strip 30 having apertures 31$a$-31$f$ disposed therein, and light detector 40 comprising photodiodes 41$a$ (A) and 41$b$ (A\). In optical encoder 10, collimated light beam 22 emitted by light emitter 20 projects light onto code wheel 60. Collimated light beam 22 is interrupted by masked or optically non-transparent portions disposed between apertures 31$a$-31$f$ as code wheel 60 rotates in first direction 110 or in second direction 112. (Note that code wheel 60 rotates substantially in a plane defined approximately by collimated light beam 22 as it is projected from light emitter 20 towards light detector 40.) Portions 50$a$ and 50$b$ of collimated light beam 22 project through apertures 31$e$ and 31$d$ onto light detector 40 and sweep across photodiodes 41$b$ (A\) an 41$a$ (A) as code wheel 60 rotates in direction 110 or 112 in the plane. As code wheel 60 moves in direction 110 or 112, the light patterns projected onto first vertical portion 70 of light detector 40 by beam portions 50$a$ and 50$b$ change, and the output signals provided by photodiodes 41$a$ and 41$b$ change correspondingly. These output signals are generally employed to generate a pair of quasi-triangular signals (as shown, for example, in FIG. 2), which are then used to determine any one or more of the position, speed and direction of code disk 60.

Referring now to FIG. 2, there are shown "triangular" signals A and A', which are compared to one another and employed to generate pulse 109 using circuitry and methods well known to those skilled in the art of optical encoders. Typically, another set of photodetectors B and B\ is also provided, where photodetectors B and B\ are positioned 90 degrees out of phase with respect to photodetectors A and A\, and which are employed to generate another pulse (not shown in FIG. 3). Pulses for photodetectors A and A\, and B and B\, are generated which are 90 degrees out of phase with respect to one another. As shown in FIG. 2, "triangular" signals A and A', which for purposes of subsequent interpolation processing would optimally be linear or straight between maximum and minimum portions thereof, exhibit curved portions near the tops and bottoms thereof. These curved portions are due to undesirable capacitance effects, and complicate considerably any subsequent attempts at interpolation.

In an encoder of the type shown in FIG. 1, the spatial resolution of device 10 is determined according to the specific requirements at hand. More particularly, the distances or spacing between adjoining photodetectors A and A\ (41$a$ and 41$b$, respectively), is typically determined according to the particular requirements of a given customer or end user. Time and effort are required to implement such requirements, especially in respect of wafer fabrication when an unusual or new spatial resolution for device 10 is required.

One technique employed in the prior art to change or adjust the spatial resolution provided by device 10 is to employ one or more reticles disposed between light emitter 20 and light detector 40. FIG. 3 shows one such arrangement, where reticle strip 60 has reticles 61 and 62 disposed therein. Reticles 61 and 62 are configured to interfere with the light beams impinging thereon, and to modify them so that the pattern of light projected on light detectors 40 is changed. Reticles 61 and 62 are specifically configured to provide the degree, amount and type of spatial resolution desired of encoder 10.

FIG. 4 shows one example of output signals provided by two different sets of reticles having different sizes. The large semi-sinusoidal output signals to the left of FIG. 4 are generated using large reticles 61-65 (i.e., large solid line rectangles), while the small semi-sinusoidal signals on the right of FIG. 4 are generated using small reticles (i.e., small dashed line rectangles disposed inside large reticles 61 through 65). It will be seen that the smaller reticles provide output signals having increased spatial resolution than those generated using the larger reticles. Reticle sizes can be changed according to the spatial resolution requirements for encoder 10, which is preferably configured to have photodiodes of a common size. The spatial resolution of encoder 10 is then determined by changing reticle size so long as reticle size is smaller then the photodiodes being employed. One disadvantage of the use of reticles in optical encoders is that additional high-precision optical components are required, and the cost of the resulting encoder increases accordingly.

Continuing to refer to FIG. 4, it will be seen that the large and small sinusoidal signals are not linear, and thus are difficult to use as a basis for interpolation in processing circuitry such as an integrated circuit ("IC") or digital signal processing ("DSP") IC.

One commonly-employed scheme in the prior art for providing increased resolution interpolated output signals from an optical encoder system is to systematically reducing the amplitude of the input signals. These reduced amplitude signals are then compared to reference signals through XOR operations to generate interpolated bits. See, for example, U.S. Pat. No. 6,355,927 to Snyder entitled "Interpolation Methods and Circuits for Increasing the Resolution of Optical Encoders" One disadvantage of such an approach is that the number of comparators must be doubled for every additional bit that is to be interpolated. For example, at 2× interpolation ($2^1$), a minimum of 8 comparators are required, and the number of comparators required beyond that doubles for every $2^n$ interpolation that is desired. Thus, in the case where 32× ($2^5$) interpolation is required, 128 comparators will be required. The use of so many comparators increases design and IC costs.

What is needed is interpolation circuitry for motion encoding systems where the spatial resolution of an encoder may be adjusted or manipulated without the use of additional optical components, reticle strips or reticles, and where spatial resolution adjustments may be effected quickly and accurately without unduly increasing cost. What is also needed is interpolation circuitry for motion encoding systems having improved immunity from noise, that is capable of providing high interpolation factors, that can provide highly accurate interpolation output signals, and that does not unduly increase circuit complexity, design and/or cost.

SUMMARY

In some embodiments, there is provided a method of linearizing and subsequently digitally interpolating a sinusoidal analog signal generated by a motion encoder, the sinusoidal analog signal having a first frequency, comprising providing the analog signal to each of a plurality of comparators as inputs thereto, providing positive and negative reference voltages to opposite ends of a resistor string comprising a plurality of scaling and linearizing resistors arranged in series, each succeeding resistor in the resistor string being scaled differently in accordance with one of a sine, cosine, arc sine or arc cosine function, the resulting scaled and linearized voltages provided by the resistor string being provided as scaled and linearized input signals to corresponding ones of a plurality of comparators, each of the comparators receiving as inputs thereto the analog signal and a corresponding scaled and linearized input signal, and providing as outputs therefrom comparator outputs, and providing the comparator outputs to an analog-to-digital converter ("ADC") and a processor to yield at least one digitally interpolated output signal therefrom, wherein each of the at least one interpolated output signals has a corresponding frequency that is an integer multiple of the first frequency, and outputs provided by the ADC to the processor are substantially linearized.

In other embodiments, there is provided a method of linearizing and subsequently digitally interpolating first and second sinusoidal analog signals generated by a motion encoder and 90 degrees out of phase respecting one another, the first and second sinusoidal analog signals having substantially the same first frequency, comprising providing the first analog signal to a plurality of first comparators as inputs thereto, providing the second analog signal to a first end of a first resistor string comprising a plurality of first scaling and linearizing resistors arranged in series, each succeeding resistor in the first resistor string being scaled differently in accordance with one of a tangent and arc tangent function, the resulting first scaled and linearized voltages provided by the first resistor string being provided as first scaled input signals to corresponding ones of the plurality of first comparators, each of the first comparators receiving as inputs thereto the first analog signal and a corresponding first scaled and linearized input signal, and providing as outputs therefrom first comparator outputs, and providing the first comparator outputs to an analog-to-digital converter ("ADC") and a processor to yield at least one digitally interpolated first output signal, wherein each of the at least one interpolated first output signals has a corresponding frequency that is an integer multiple of the first frequency, and outputs provided by the ADC to the processor are substantially linearized.

In still other embodiments, there is provided a circuit for linearizing and subsequently digitally interpolating a sinusoidal analog signal generated by a motion encoder, the sinusoidal analog signal having a first frequency, comprising a plurality of comparators configured to receive as inputs thereto the analog signal, a resistor string comprising a plurality of scaling and linearizing resistors arranged in series, each succeeding resistor in the resistor string being scaled differently in accordance with one of a sine, cosine, arc sine or arc cosine function, positive and negative reference voltages being provided to opposite ends of the resistor string, the resulting scaled and linearized voltages provided by the resistor string being provided as scaled input signals to corresponding ones of the plurality of comparators, each of the comparators receiving as inputs thereto the analog signal and a corresponding scaled and linearized input signal and providing as outputs therefrom comparator outputs, an analog-to-digital converter ("ADC") configured to receive the comparator outputs and provide linearized outputs corresponding to each of the comparator outputs therefrom, and a processor configured to receive the linearized outputs from the ADC and to generate at least one digitally interpolated output signal therefrom, wherein each of the at least one interpolated output signals has a corresponding frequency that is an integer multiple of the first frequency.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

FIG. 2 shows representative output signals A, A\ and a pulse provided by an optical encoder;

The drawings are not necessarily to scale. Like numbers refer to like parts or steps throughout the drawings, unless otherwise noted.

DETAILED DESCRIPTION OF SOME PREFERRED EMBODIMENTS

Figure 1:
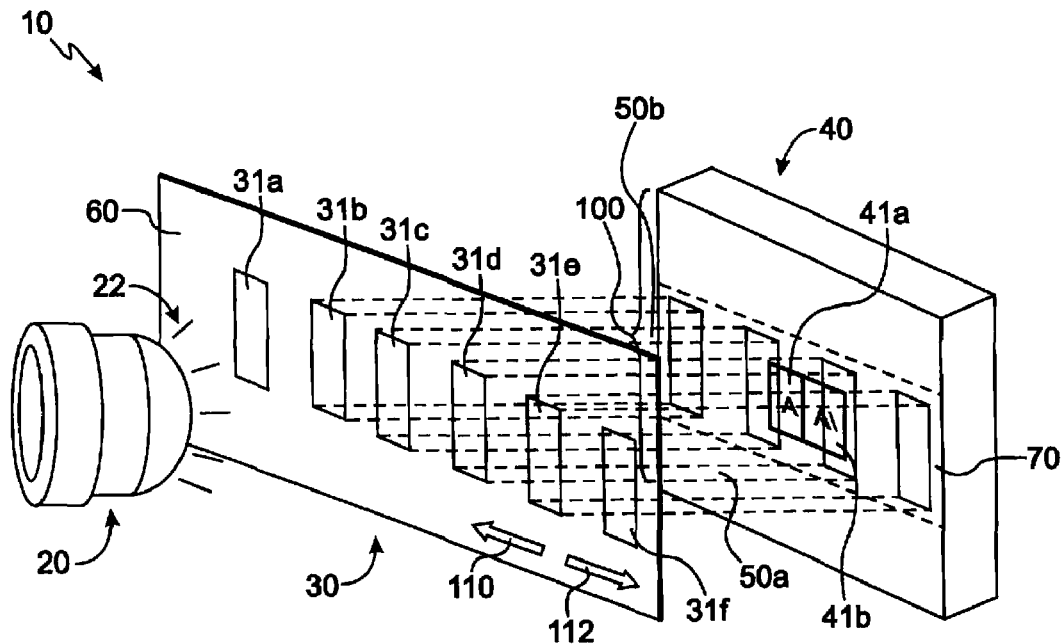
FIG. 1 shows an optical encoder 10 of the prior art.
Figure 2:
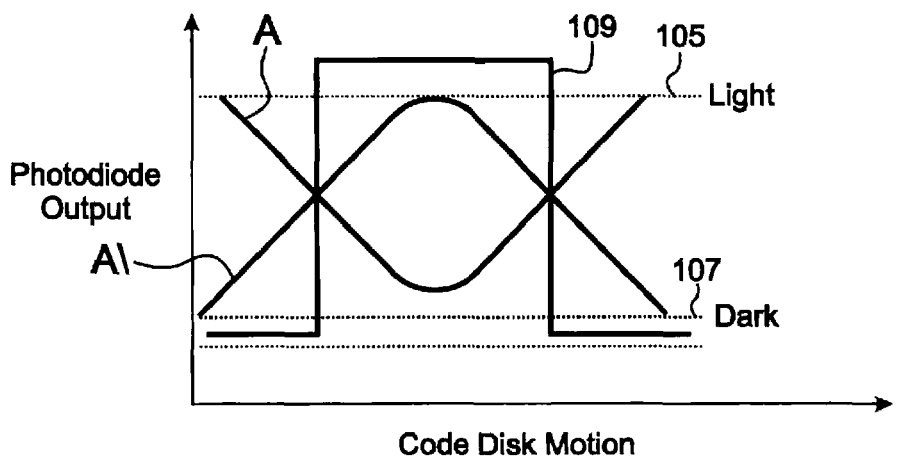
FIG. 2 shows representative output signals A, A\ and a pulse generated in accordance with such output signals.
Figure 3:
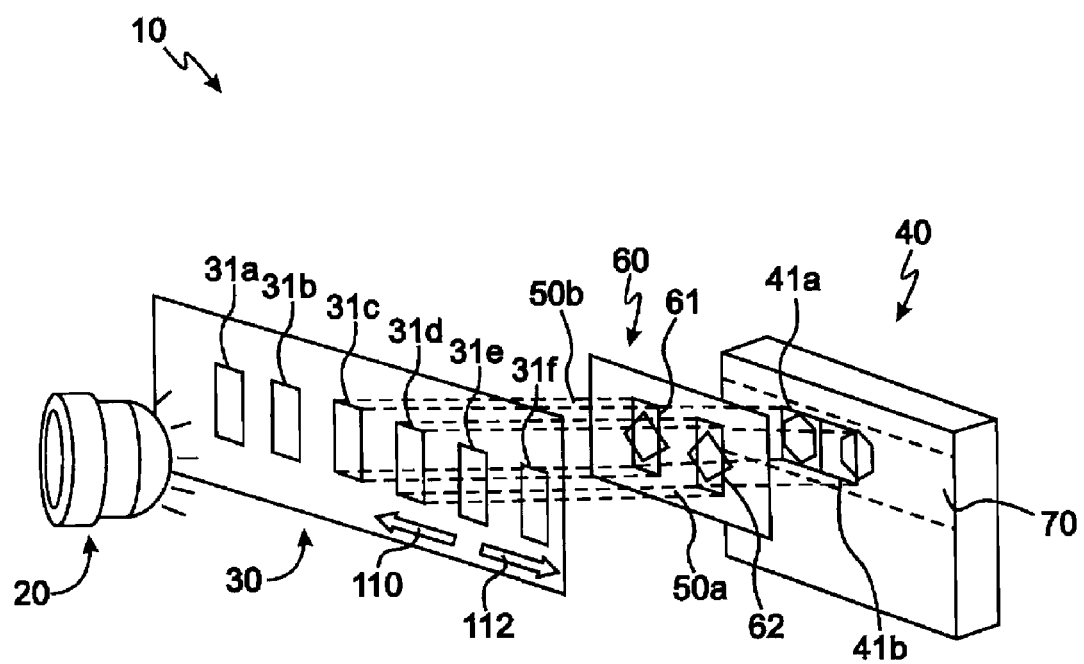
FIG. 3 shows another optical encoder 10 of the prior art.
Figure 4:
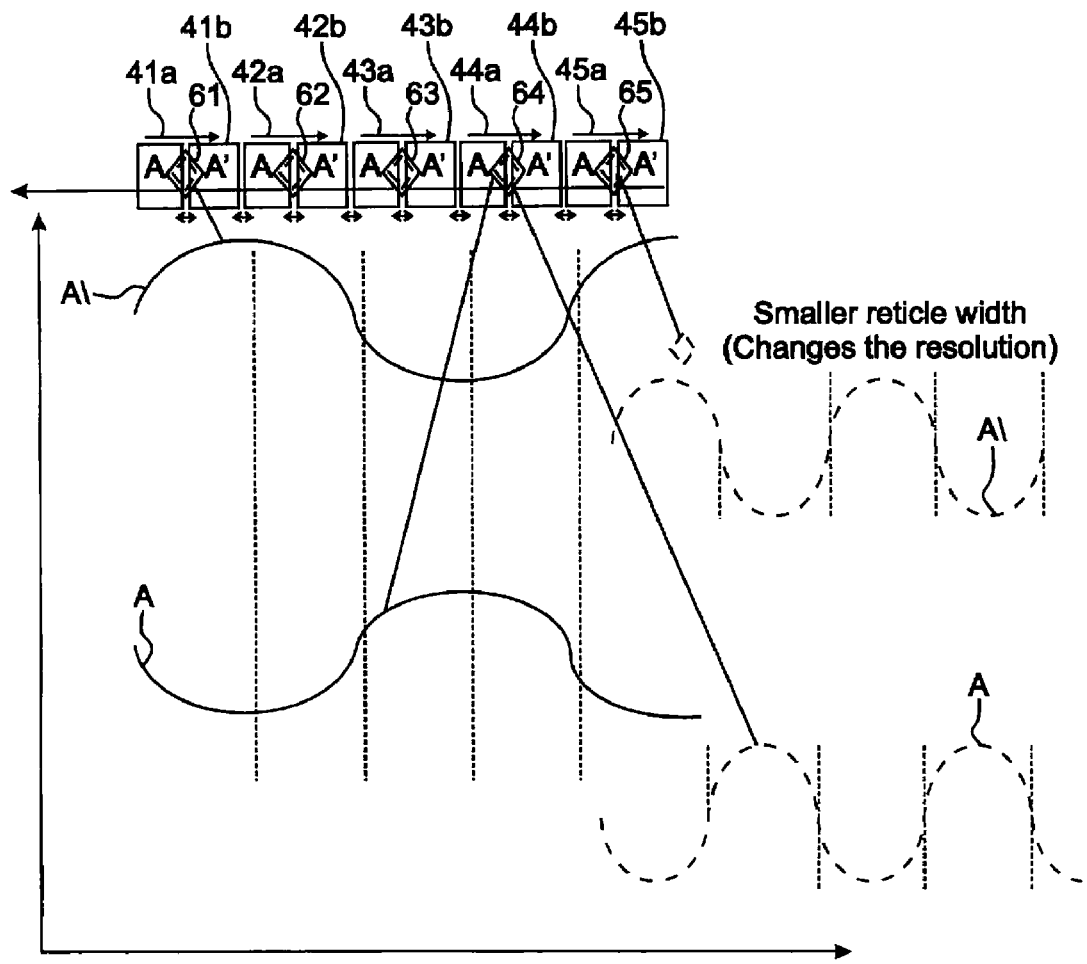
FIG. 4 illustrates how the spatial resolution of an optical encoder may be adjusted through the use of reticles.
Figure 5:
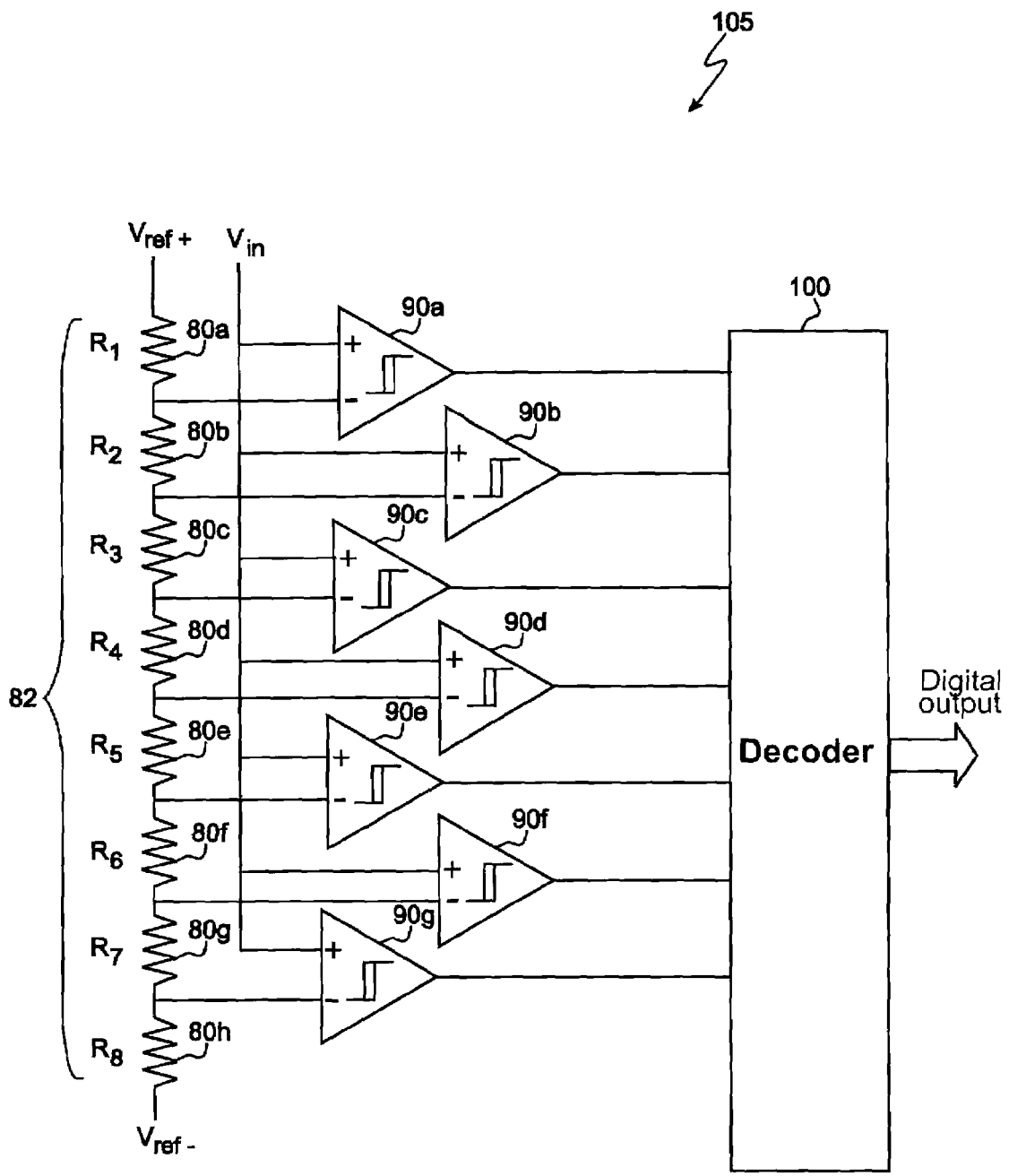
FIG. 5 shows one embodiment of a single channel interpolation circuit.

Referring first to FIG. 5, there is shown one embodiment of circuit 105 for linearizing and subsequently digitally interpolating a sinusoidal analog signal generated by a motion encoder, where the sinusoidal analog signal has a first frequency. As shown, circuit 105 in FIG. 5 comprises a plurality of comparators 90a through 90g configured to receive as inputs thereto analog signal $V_{in}$. Resistor string 82 comprises a plurality of scaling resistors 80a through 80h arranged in series, each succeeding resistor in the resistor string being scaled differently in accordance with one of a sine, cosine, arc sine or arc cosine function. Positive and negative reference voltages $V_{ref-}$ and $V_{ref+}$ are provided to opposite ends of resistor string 82. The resulting scaled and linearized voltages provided by resistor string 82 are provided as scaled an linearized input signals to corresponding ones of the plurality of comparators 90a through 90g, where each of comparators 90a through 90g receive as inputs thereto analog signal $V_{in}$ and a corresponding scaled and linearized input signal. Comparators 90a through 90g provided as outputs therefrom comparator outputs, which are routed to analog-to-digital converter ("ADC") or decoder 100. ADC 100 is configured to receive the comparator outputs and provide linearized outputs corresponding to each of the comparator outputs. A processor (not shown in FIG. 5) is configured to receive the linearized outputs from ADC 100 and to generate at least one digitally interpolated output signal therefrom, where each of the at least one interpolated output signals has a corresponding frequency that is an integer multiple of the first frequency.

Note that depending on the particular configuration of circuit 105 that is employed comparators 90a through 90g may be hysteresis or zero hysteresis comparators, and that adjoining pairs of comparators, for example comparators 90a and 90b, and 90c and 90d, can be configured to provide outputs corresponding to a single digital bit. The at least one interpolated output signal preferably comprises digital pulses having logic high levels separated by logic low levels.

Continuing to refer to FIG. 5, in one embodiment the analog signal or $V_{in}$ is a cosine signal and resistor string 82 is scaled in accordance with a cosine or arc cosine function. Such a cosine signal may be one of a cosine + signal and a cosine − signal. In another embodiment, the analog signal or $V_{in}$ is a sine signal and resistor string 82 is scaled in accordance with a sine or arc sine function. Such a sine signal may be one of a sine + signal and a sine − signal. In one embodiment, positive and negative reference voltages $V_{ref-}$ and $V_{ref+}$ correspond approximately and respectively to a positive maximum and a negative minimum of the analog signal.

The processor which receives outputs from ADC 100 may be one of a digital processing block, an arithmetic logic unit ("ALU"), a central processing unit ("CPU"), a microprocessor, a controller, an application specific integrated circuit ("ASIC"), or a computer. In one embodiment, the processor comprises a divider circuit for interpolating the substantially linearized outputs provided by the ADC. Circuit 105 is an interpolation processing circuit, and may include scaling and linearizing resistors 82, comparators 90a through 90g, ADC 100 and the processor. In one embodiment, such an interpolation processing circuit is fabricated using a CMOS or BiCMOS process. Note that the substantially linearized outputs provided by ADC may be further interpolated in accordance with clock signals provided to or generated by the processor.

Continuing to refer to FIG. 5, it will be seen that in one embodiment circuit 105 generates interpolated signals by using a flash ADC to linearize input sinusoidal signals. The digital bits output by ADC 100 are input to a signal processing block (not shown in FIG. 5) which digitally interpolates the input sinusoidal signals to the number of bits required by, for example, using a digital divider. FIG. 5 illustrates a 3-bit flash ADC embodiment of circuit 105, though it is to be noted that the invention is not limited to embodiments comprising resistor string flash ADCs, or 3-bit circuits. Instead, ADC 100 may be any type of analog-to-digital converter or decoder capable of linearizing inputs, and any desired number of bits within reason may be generated by circuit 105. Circuit 105 of FIG. 5 illustrates but one embodiment of a circuit configured to linearize a sinusoidal input signal so that linearized values for digital bits can be provided by ADC 100.

Continuing to refer to FIG. 5, in the embodiment shown, $V_{in}$ is a sinusoidal output signal provided by an optical encoder, and the $V_{ref+}$ and $V_{ref-}$ are reference voltages for ADC 100. In one embodiment, $V_{ref+}$ is the $V_{max}$ of the sinusoidal input signal and $V_{ref-}$ is the $V_{min}$ of the sinusoidal input signal. $V_{in}$ is compared with the modified reference voltages according to the coefficient values that have been assigned to individual resistors $R_1$ through $R_8$ of resistor string 82 by means of comparators 90a through 90g. The individual outputs of comparators 90a through 90g are processed by ADC/decoder 100 and combined to form a digital output.

Figure 6:
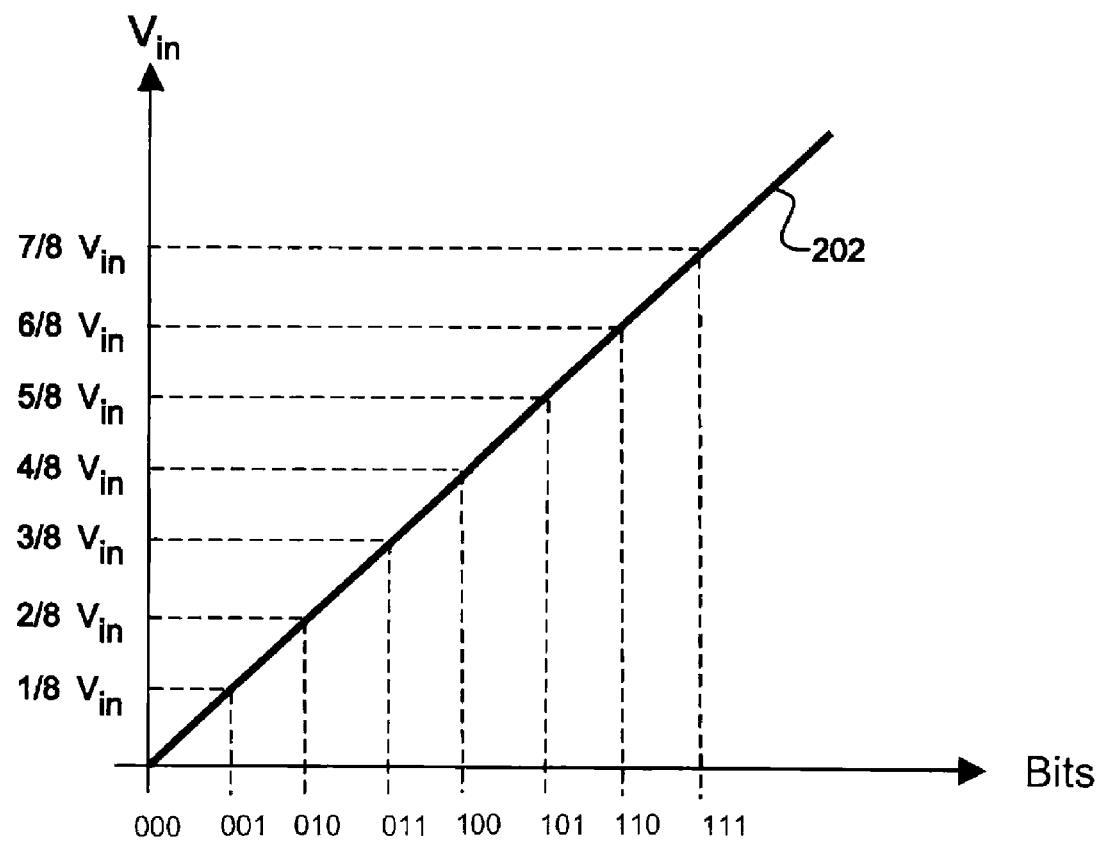
FIG. 6 shows an idealized linear input signal resulting in digital output signals that are evenly spaced in respect of time.

Referring now to FIG. 6, there is shown a hypothetical monotonically increasing and linear input signal 202, scaled portions of which are provided as inputs to ADC 100 using resistors of equal value in resistor string 82. As shown in FIG. 6, monotonically and evenly increasing signal 202 results in evenly spaced output digital signals being provided by ADC 100, where digital bits 000, 001, 010, 011, 100, 101, 110 and 111 are equally separated in time from one another, which in turn results in interpolated output pulses of equal width. Such a result is highly desirable, but impossible to achieve using a non-linear sinusoidal signal as an input to ADC that has been scaled using resistors of equal value in resistor string 82.

Figure 7:
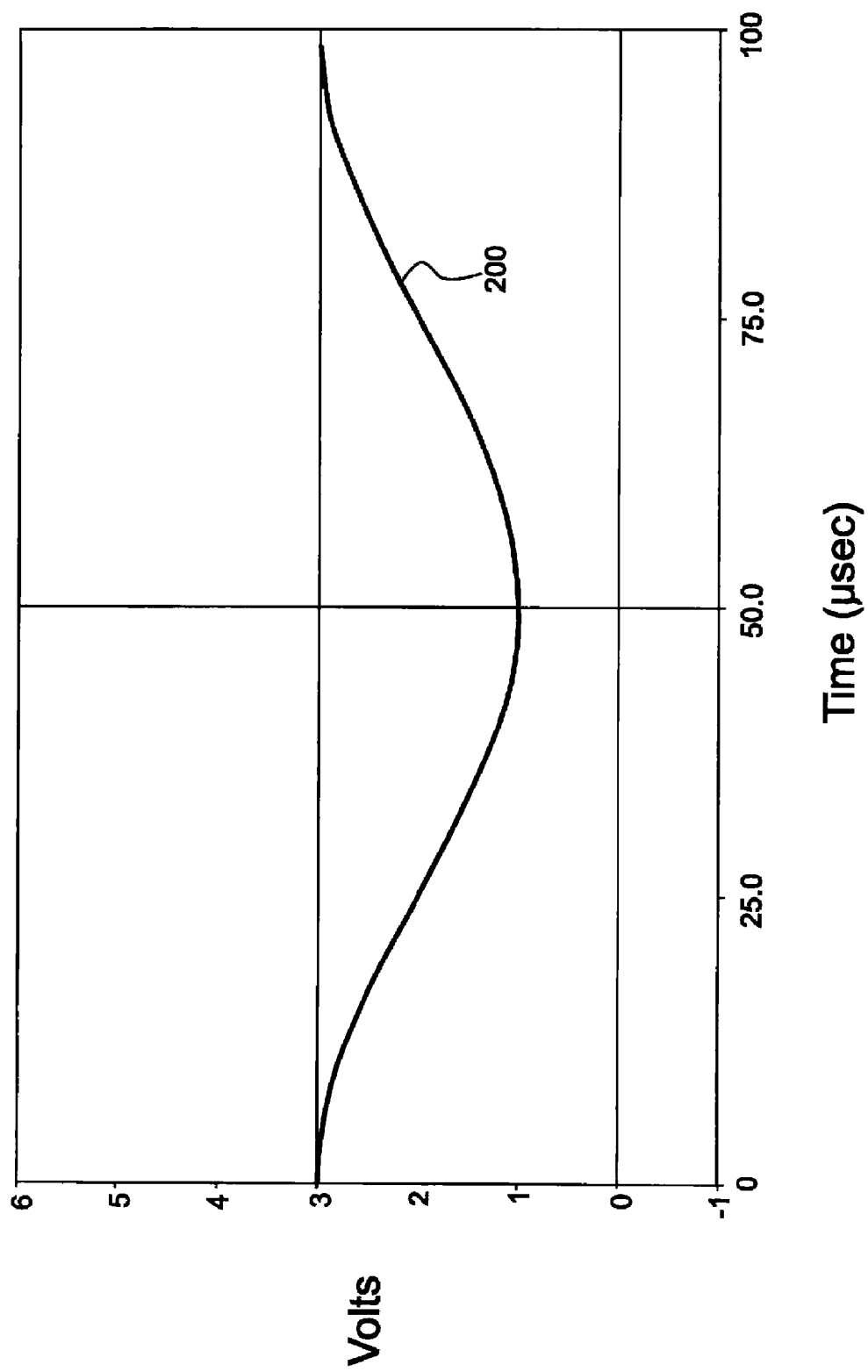
FIG. 7 shows a sinusoidal input signal that has been scaled using resistors of equal value in a resistor string.
Figure 8:
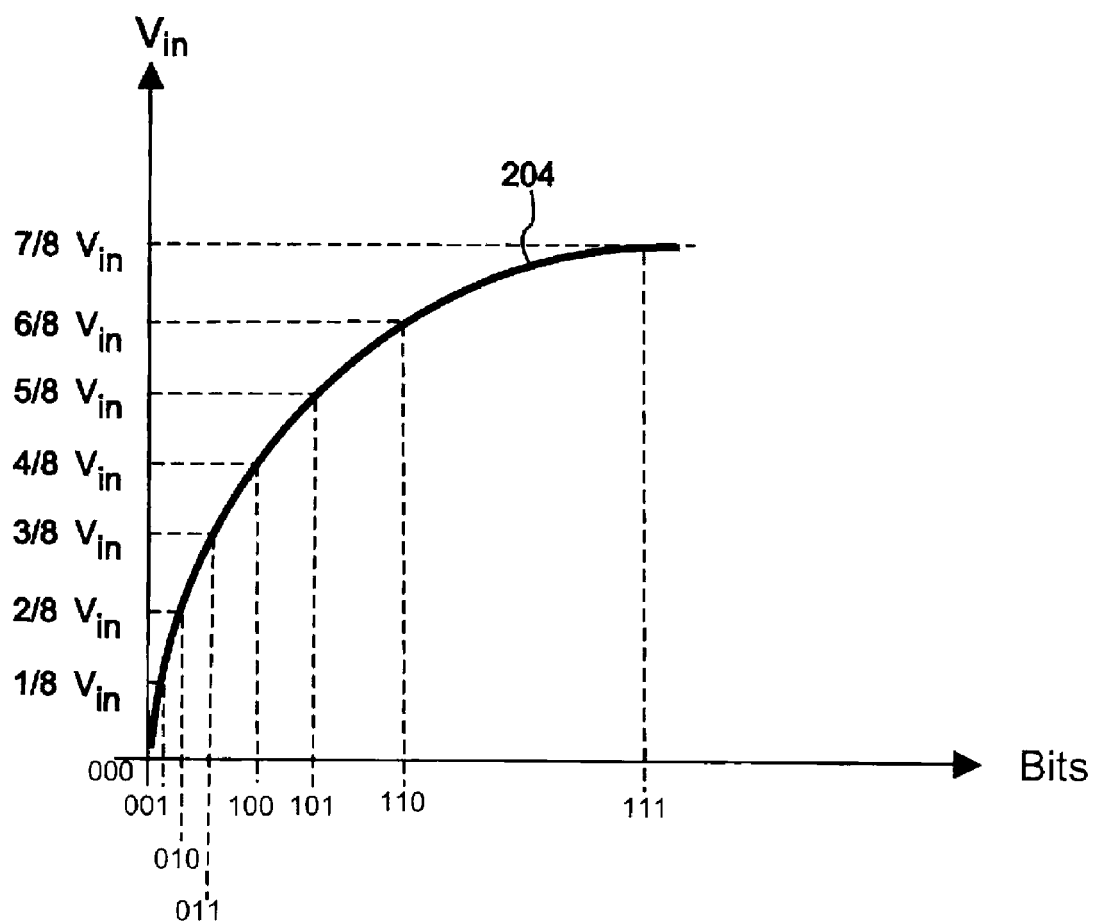
FIG. 8 shows the non-evenly-spaced digital outputs resulting from the signal of FIG. 7.

FIG. 7 shows sinusoidal input signal 200, which when scaled using a resistor string having resistors of equal values produces interpolation pulses of unequal and differing widths (see FIG. 8). In FIG. 8, it will be seen that the various outputs provided by equal-value resistors in a resistor string result in digital outputs from ADC 100 that are not equally spaced in time.

Figure 9:
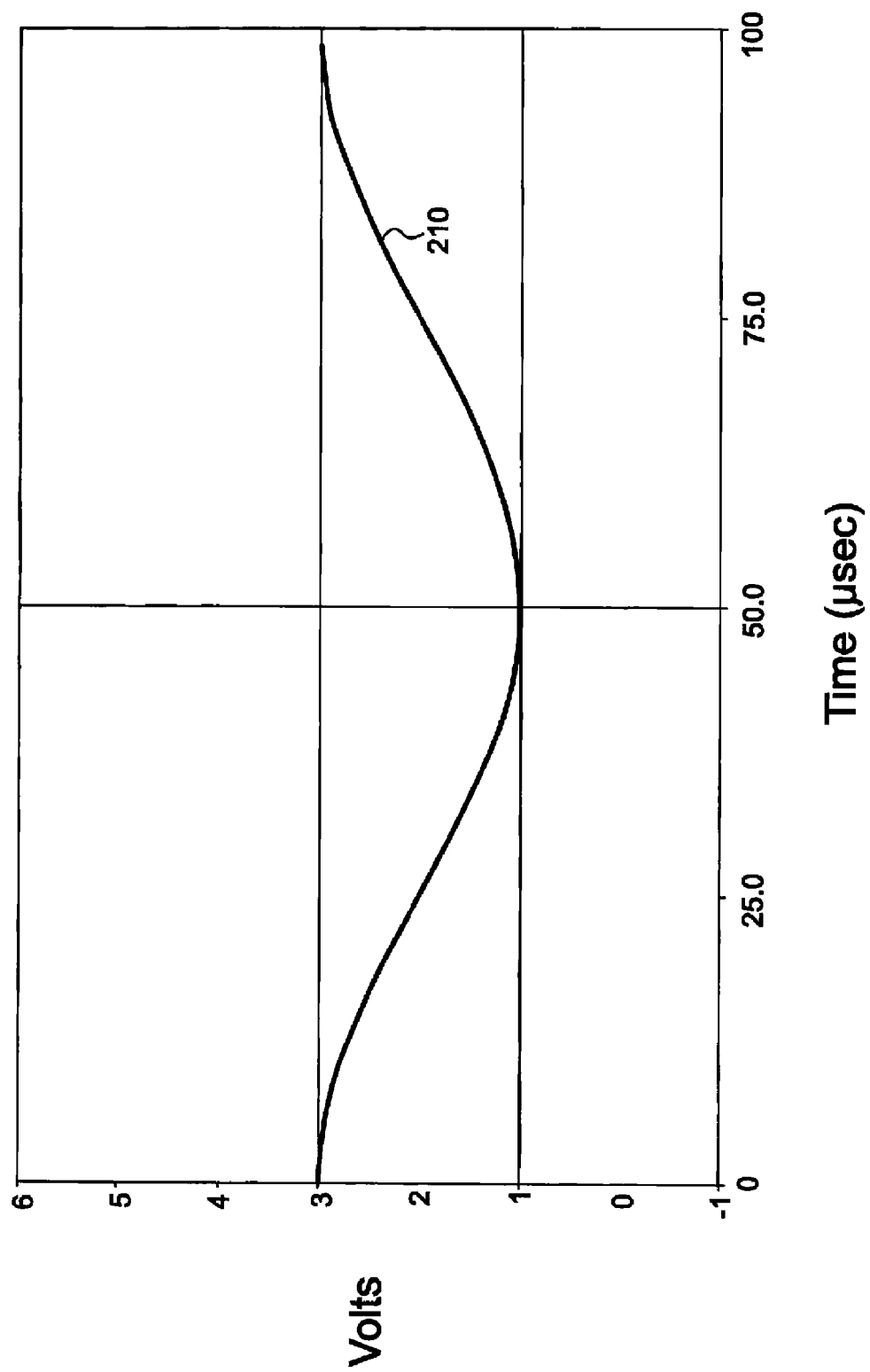
FIG. 9 shows a sinusoidal input signal that has been scaled using resistors in a resistor string having coefficient values corresponding to a cosine function.
Figure 10:
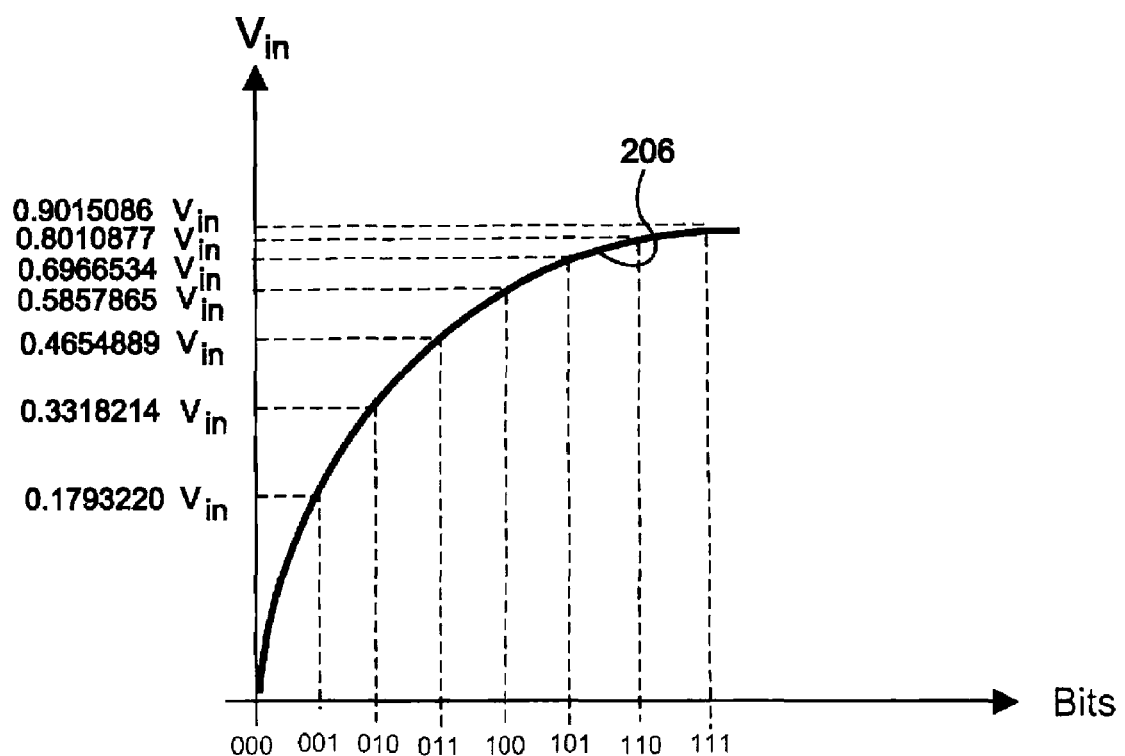
FIG. 10 shows the evenly spaced digital outputs resulting from the signal of FIG. 9.

Contrariwise, and referring now to FIGS. 9 and 10, sinusoidal input signal 210 is shown after having been scaled using a resistor string having resistors of values scaled according to a cosine function. The waveform of FIG. 9 produces interpolation pulses of equal widths, as is shown by referring to FIG. 10. In FIG. 10, it will be seen that the various outputs provided by cosine-scaled resistors in a resistor string result in digital outputs from ADC 100 that are equally spaced in time.

Table 1 below illustrates a comparison between pulse time-width results provided by conventionally-assigned resistor values in resistor string 82 (where the resistors all have the same value) and cosine-scaled resistor values in resistor string 82. As shown in Table 1, interpolated pulse widths provided by resistors of equal value are unequal and vary significantly from pulse to pulse. The nominal desired pulse width is 6.25 microseconds. Further as shown in Table 1, interpolated pulse widths provided by resistors of cosine-scaled values are equal and do not vary significantly from pulse to pulse.

TABLE 1

Comparison of Interpolated Pulse Widths

| Pulse number | Pulse Widths for Equal Resistor Values (microseconds) | Pulse Widths for Cosine-Scaled Coefficient Resistor Values (microseconds) |
|---|---|---|
| 1 | 11.628 | 6.4149 |
| 2 | 5.1455 | 6.2049 |
| 3 | 4.3051 | 6.2314 |
| 4 | 3.9954 | 6.2453 |
| 5 | 4.0521 | 6.2545 |
| 6 | 4.3106 | 6.2617 |
| 7 | 5.1666 | 6.2924 |
| 8 | 11.3967 | 6.0950 |

Table 2 below illustrates cosine-scaled resistor coefficient values for individual resistors R1 through R9 in FIG. 5 according to one embodiment.

TABLE 1

Cosine-Scaled Coefficient Resistor Values for FIG. 5

| Degrees | Cosine (degrees) | Coefficient Resistor Values (for total resistor value of 20k) | Resistor |
|---|---|---|---|
| 0 | 1 | | |
| 22.5 | 0.923879532 | (1 − 0.923879532) * 10 k = 761.20468 | R1 |
| 45 | 0.707106781 | 2167.727513 | R2 |
| 67.5 | 0.382683432 | 3244.233488 | R3 |
| 90 | 0 | 3826.83432 | R4 |
| 67.5 | 0.382683432 | 3826.83432 | R5 |
| 45 | 0.707106781 | 3244.233488 | R6 |
| 22.5 | 0.923879532 | 2167.727513 | R7 |
| 0 | 1 | 761.20468 | R8 |

Figure 11:
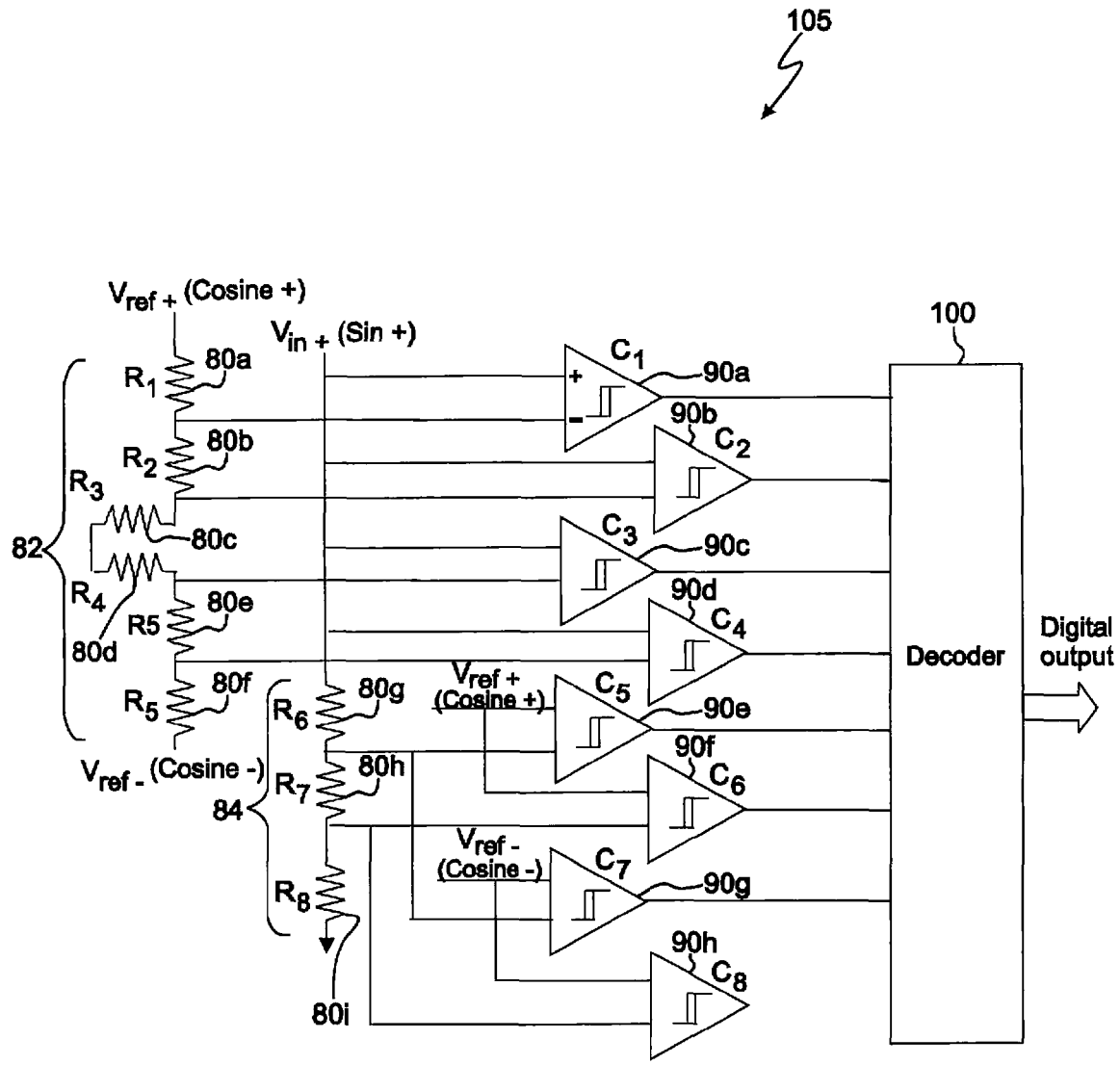
FIG. 11 shows one embodiment of a two-channel interpolation circuit.

Referring now to FIG. 11, there is shown one embodiment of circuit 105 for linearizing and subsequently digitally interpolating first and second sinusoidal analog signals (cosine and sine, respectively) generated by a motion encoder and 90 degrees out of phase respecting one another, where the first and second sinusoidal analog signals having substantially the same first frequency. As shown in FIG. 11, the first analog signal ($V_{in}$ or sine+) is provided to a plurality of first comparators 90a, 90b, 90c and 90d as an input thereto. The second analog signal ($V_{ref+}$ or cosine+) is provided to a first end of first resistor string 82, which comprises a plurality of first linearizing and scaling resistors $R_1$ through $R_6$ arranged in series, each succeeding resistor in the first resistor string being scaled differently in accordance with one of a tangent and arc tangent function. The resulting first scaled and linearized voltages provided by first resistor string 82 are provided as first scaled and linearized input signals to corresponding ones of the plurality of first comparators 90a through 90d. Each of the first comparators therefore receives as inputs thereto the first analog signal ($V_{in}$ or sine+) and a corresponding first scaled and linearized input signal. Outputs from the first comparators are provided to ADC 100, which in turn provides linearized digital outputs to a processor (not shown in FIG. 11) to yield at least one digitally interpolated first output signal, where each of the at least one interpolated first output signals has a corresponding frequency that is an integer multiple of the first frequency. Note that the outputs provided by ADC 100 to the processor are substantially linearized.

Continuing to refer to FIG. 11, note that the first analog signal ($V_{in}$ or sine+) is also provided to a second resistor string 84 comprising a plurality of second scaling and linearizing resistors $R_7$ through $R_9$ arranged in series, each succeeding resistor in the second resistor string also being scaled differently in accordance with one of a tangent and arc tangent function. The resulting second scaled and linearized voltages provided by second resistor string 84 are provided as second scaled and linearized input signals to corresponding ones of a plurality of second comparators 90e through 90h. Each of the second comparators 90e through 90h receives as inputs thereto corresponding second scaled and linearized input signals and the second analog signal or its complement. The outputs from the second comparators are then provided to ADC 100 then to the processor to yield at least one digitally interpolated second output signal, where each of the at least one interpolated second output signals has a corresponding frequency that is an integer multiple of the first frequency.

Note that depending on the particular configuration of circuit 105 that is employed comparators 90a through 90h may be hysteresis or zero hysteresis comparators, and that adjoining pairs of comparators, for example comparators 90a and 90b, and 90c and 90d, can be configured to provide outputs corresponding to a single digital bit. The interpolated first and second output signals preferably comprise digital pulses having logic high levels separated by logic low levels.

Still referring to FIG. 11, note that circuit 105 is configured to process two analog signals (a cosine input signal and a sine input signal) that are provided by a two-channel optical encoder. It is for this reason that resistor strings 82 and 84 have resistor coefficient values selected according to a tangent or arctangent function. Resistor coefficient values for resistors $R_1$ through $R_9$ of FIG. 11 are set forth in Table 3 below.

TABLE 3

Tangent-Scaled Coefficient Resistor Values for FIG. 11

| Degrees | Tangent (degrees) | Coefficient Resistor Values (for total resistor value of 20k) | Resistor |
|---|---|---|---|
| 45 | 1 | | |
| 33.75 | 0.668178637 | (1 − 0.668178637) * 10 k = 3318.213621 | R1 |
| 11.25 | 0.198912367 | 4692.6627 | R2 |
| 0 | 0 | 1989.12367 | R3 |
| 0 | 0 | 1989.12367 | R4 |
| 11.25 | 0.198912367 | 4692.6627 | R5 |
| 33.75 | 0.668178637 | 3318.213621 | R6 |
| 33.75 | 0.668178637 | 3318.213621 | R7 |
| 11.25 | 0.198912367 | 4692.6627 | R8 |
| 0 | 0 | 1989.12367 | R9 |

Figure 12:
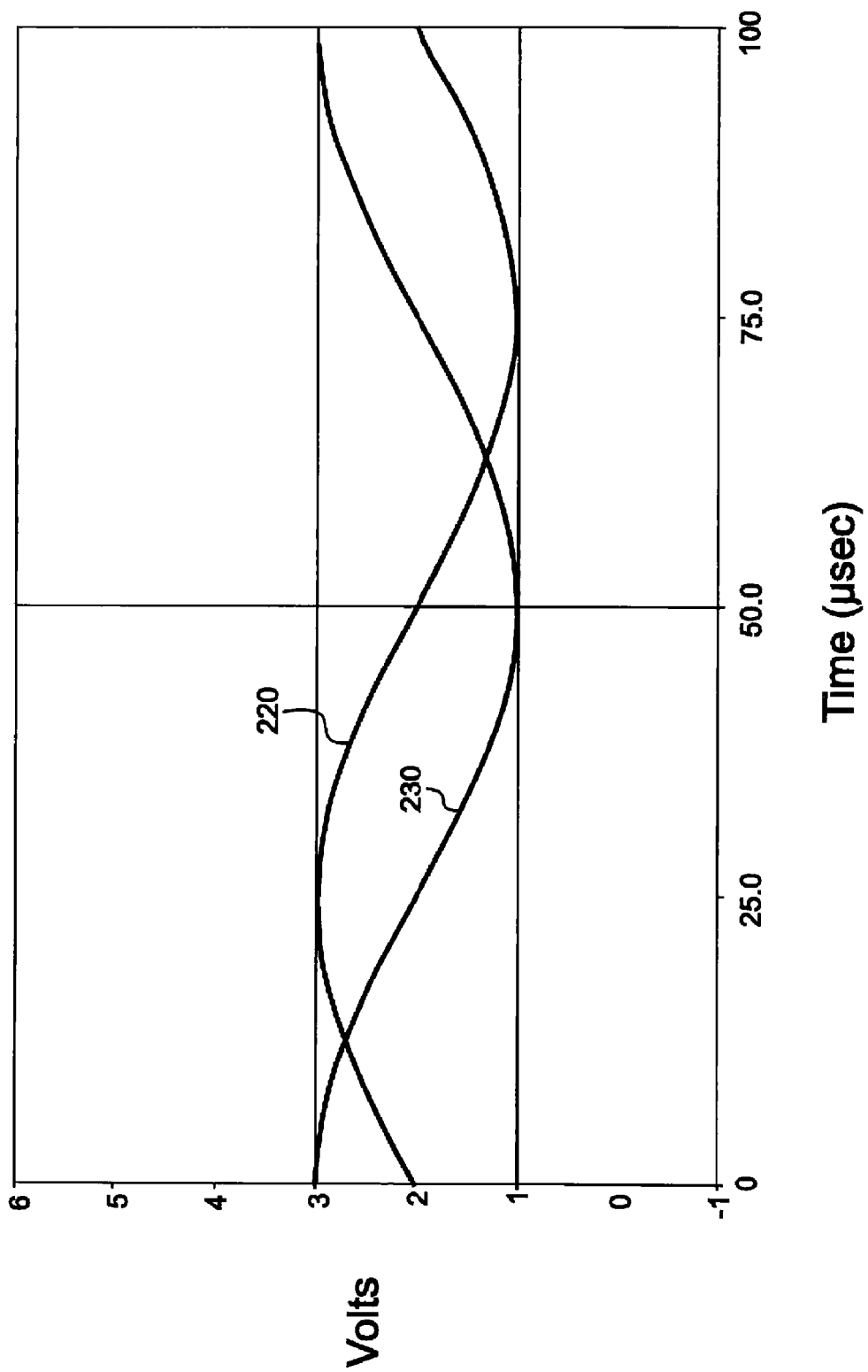
FIG. 12 shows sinusoidal input signals that has been scaled using resistors in a resistor string having coefficient values corresponding to a tangent function.

Referring now to FIG. 12, sinusoidal output signals 220 and 230 are shown after being reconstructed using the outputs from ADC 100, where the first and second analog input signals have been scaled using resistor strings 82 and 84 of FIG. 11 having resistors values scaled according to a tangent function. The waveform of FIG. 12 produces interpolation pulses of substantially equal widths and that do not vary significantly from pulse to pulse.

Figure 13:
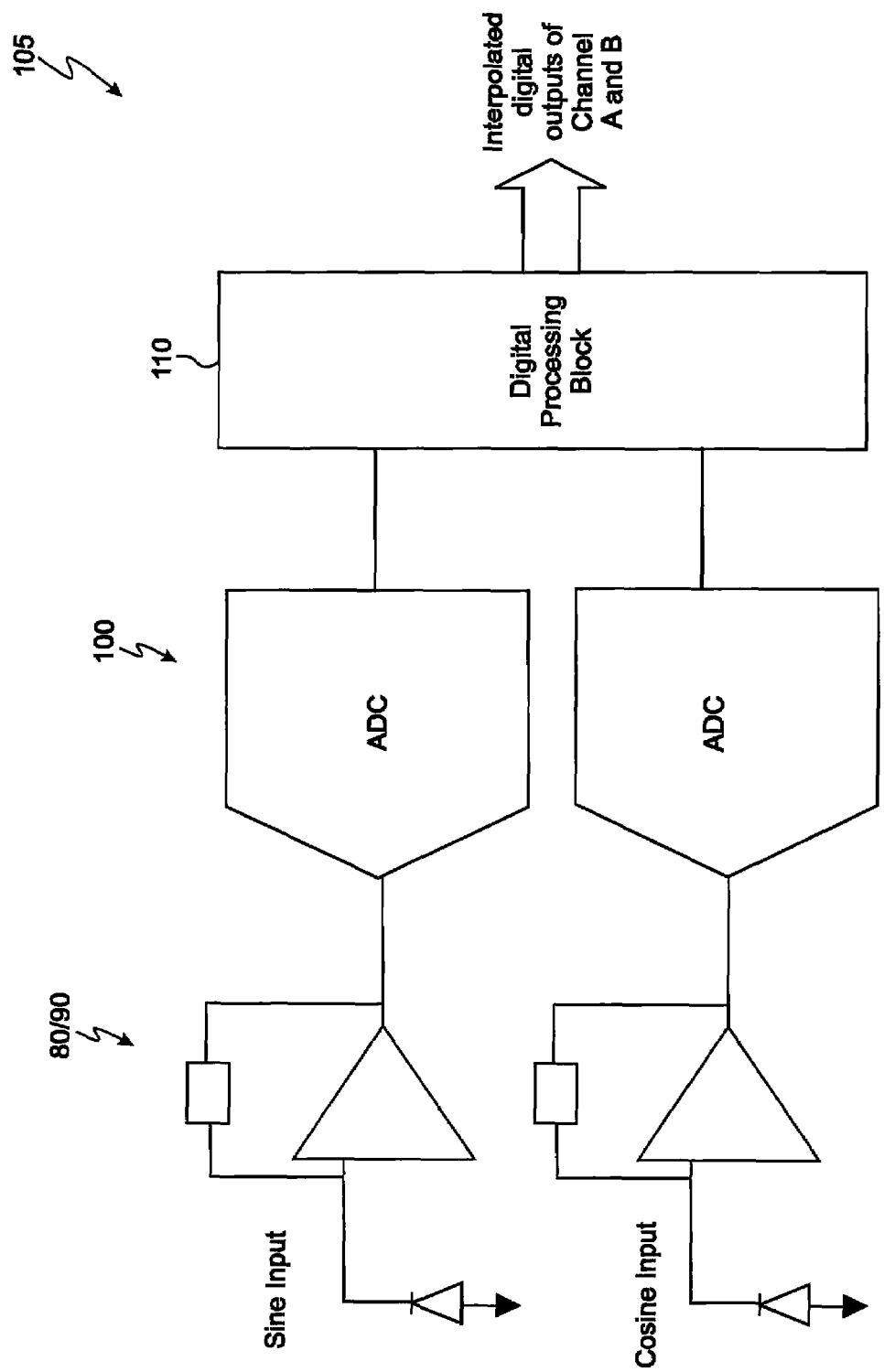
FIG. 13 shows a block diagram of one embodiment of interpolation circuit 105.

FIG. 13 shows one embodiment of a two-channel interpolation circuit 105 configured to receive sine and cosine analog signals generated by a two-channel optical encoder, and to generate interpolated output signals having higher resolution than the input analog signals provided thereto. After the two analog input signals have been converted to linearized and scaled digital outputs, the digital data provided by ADCs 100 can be interpolated using a divider circuit incorporated into processor 110. In one embodiment of processor 110, the digital data are divided in accordance with a desired interpolation factor using a divider. With analog signals having been digitized by ADC 100, interpolated signals of higher frequency than the analog signals are generated by processor 110 based on the digitized values provided thereto and clock signals provided to or generated by processor 110. Note that the speed at which processor 110 (and of interpolation circuit 105 generally) must be lower than the clock speed that is required to generate the interpolated output signals. It is an advantage of some embodiments that owing to its unique architecture and topology interpolation circuit 105 can be configured to operate at substantially higher speeds than optical encoders of the prior art, and thus is capable of providing high resolution interpolated output signals.

Figure 14:
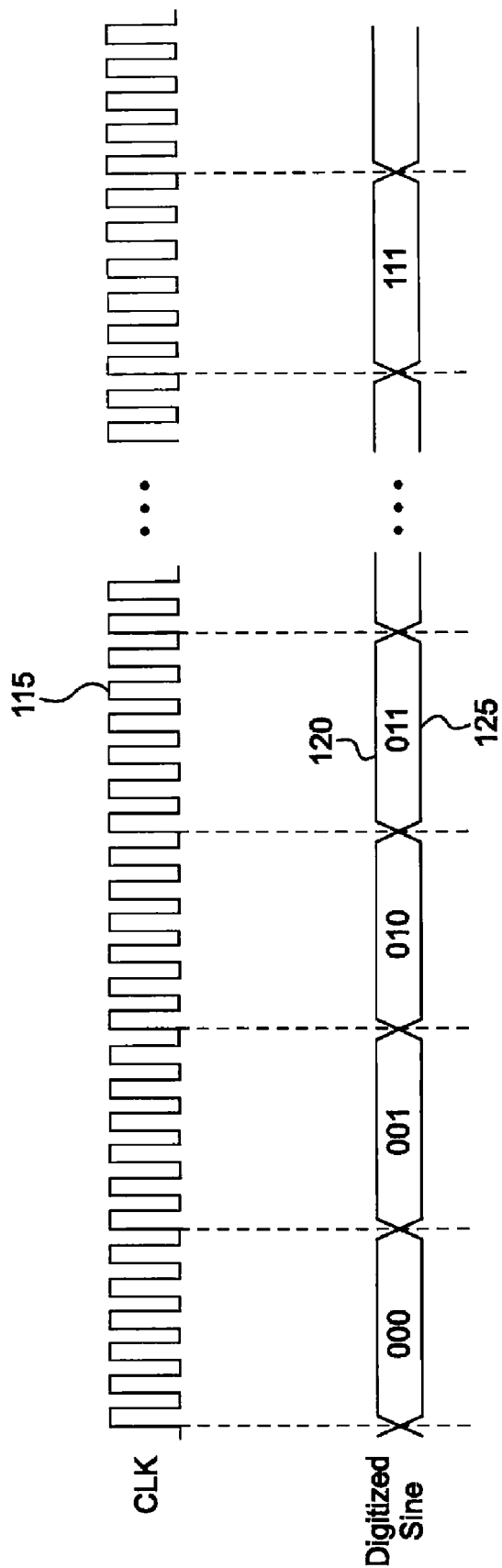
FIG. 14 shows one embodiment of a clock signal and digitized sine wave signal generated by processor 110 of interpolation circuit 105.

Referring now to FIG. 14, there is shown one embodiment of a clock signal (CLK) 115 corresponding or provided to processor 1110, and interpolated output sine signals 120 and 125 generated by processor 110. Because the code wheel of the optical encoder that generates the first and second analog signals typically rotates at a relatively constant speed, the digital bits generated by ADC 100 change according to a constant rate in respect of clock signal 115. In the example of FIG. 14, only interpolated signals 120 and 125 based on an analog input signal corresponding to a sine channel are shown, but the same concept can, of course, be applied to a cosine channel, or indeed any other type of channel.

Figure 15:
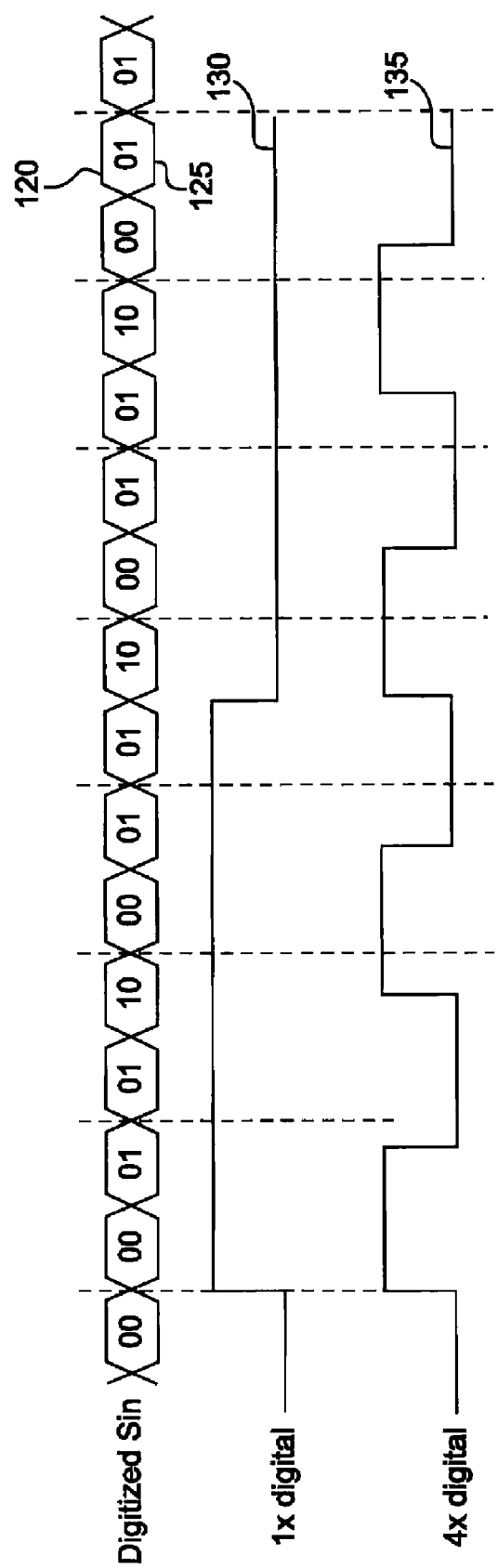
FIG. 15 shows one embodiment of trains of output pulses having different frequencies generated by processor 110 on the basis of the digitized sine wave signal of FIG. 14.

FIG. 15 shows one embodiment of interpolated output sine signals 120 and 125, and digital output pulse trains 130 and 135 s of different frequencies generated therefrom by processor 110. In the embodiment of FIG. 15, a full period of the input sine analog signal may be calculated by counting individual clock pulses in clock signal 120 as they range from digitized sine bit 000, up to 111, and back to 000 (representing one period of sin cycle) can be calculated. In such a case, and assuming the speed of the optical encoder is held constant, 12 clock cycles×14 (from 000 to 111 and back to 000)=168 clock cycles. If a 4× interpolated output signal is required, processor 110 can be configured to output a pulse every 168 clock cycles, which equals 42 clock cycles per pulse. With the analog input signals digitized, digital processing may also be performed on the sine and cosine signals to remove imperfections or noise, correct signal morphology, or otherwise filter such signals.

Some of the various embodiments presented herein have certain advantages and features, including the ability to be implemented using standard CMOS or BiCMOS manufacturing processes, the ability to be implemented with relative ease and design simplicity, the ability to be implemented in both incremental and absolute motion encoders, and the ability to provide high interpolation factors without sacrificing timing accuracy.

Included within the scope of the present invention are methods of making and having made the various components, devices and systems described herein.

Various embodiments of the invention are contemplated in addition to those disclosed hereinabove. The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. A method of linearizing and subsequently digitally interpolating a sinusoidal analog signal generated by a motion encoder, the sinusoidal analog signal having a first frequency, comprising:

providing the analog signal to each of a plurality of comparators as inputs thereto;

providing positive and negative reference voltages to opposite ends of a resistor string comprising a plurality of scaling and linearizing resistors arranged in series, each succeeding resistor in the resistor string being scaled differently in accordance with one of a sine, cosine, arc sine or arc cosine function, the resulting scaled and linearized voltages provided by the resistor string being provided as scaled and linearized input signals to corresponding ones of a plurality of comparators, each of the comparators receiving as inputs thereto the analog signal and a corresponding scaled and linearized input signal, and providing as outputs therefrom comparator outputs, and providing the comparator outputs to an analog-to-digital converter ("ADC") and a processor to yield at least one digitally interpolated output signal therefrom, wherein each of the at least one interpolated output signals has a corresponding frequency that is an integer multiple of the first frequency, and outputs provided by the ADC to the processor are substantially linearized.

2. The method of claim 1, wherein pairs of adjoining comparators provide outputs corresponding to one digital bit.

3. The method of claim 1, wherein the comparators are hysteresis comparators.

4. The method of claim 1, wherein the comparators are zero hysteresis comparators.

5. The method of claim 1, wherein the at least one interpolated output signal comprises digital pulses having logic high levels separated by logic low levels.

6. The method of claim 1, wherein the analog signal is a cosine signal and the resistor string is scaled in accordance with a cosine or arc cosine function.

7. The method of claim 6, wherein the cosine signal is one of a cosine+signal and a cosine−signal.

8. The method of claim 1, wherein the analog signal is a sine signal and the resistor string is scaled in accordance with a sine or arc sine function.

9. The method of claim 8, wherein the sine signal is one of a sine+signal and a sine−signal.

10. The method of claim 1, wherein the positive and negative reference voltages correspond approximately and respectively to a positive maximum and a negative minimum of the analog signal.

11. The method of claim 1, wherein the processor is one of a digital processing block, an arithmetic logic unit ("ALU"), a central processing unit ("CPU"), a microprocessor, a controller, an application specific integrated circuit ("ASIC"), and a computer.

12. The method of claim 1, wherein an interpolation processing circuit comprises the comparators, the scaling resistors, the ADC and the processor.

13. The method of claim 12, wherein the interpolation processing circuit is fabricated using a CMOS process.

14. The method of claim 1, wherein the processor comprises a divider circuit for interpolating the substantially linearized outputs provided by the ADC.

15. The method of claim 14, wherein the substantially linearized outputs are further interpolated in accordance with clock signals provided to or generated by the processor.

16. A method of linearizing and subsequently digitally interpolating first and second sinusoidal analog signals generated by a motion encoder and 90 degrees out of phase respecting one another, the first and second sinusoidal analog signals having substantially the same first frequency, comprising:

providing the first analog signal to a plurality of first comparators as inputs thereto;

providing the second analog signal to a first end of a first resistor string comprising a plurality of first and linearizing scaling resistors arranged in series, each succeeding resistor in the first resistor string being scaled differently in accordance with one of a tangent and arc tangent function, the resulting first scaled and linearized voltages provided by the first resistor string being provided as first scaled and linearized input signals to corresponding ones of the plurality of first comparators, each of the first comparators receiving as inputs thereto the first analog signal and a corresponding first scaled and linearized input signal, and providing as outputs therefrom first comparator outputs, and providing the first comparator outputs to an analog-to-digital converter ("ADC") and a processor to yield at least one digitally interpolated first output signal, wherein each of the at least one interpolated first output signals has a corresponding frequency that is an integer multiple of the first frequency, and outputs provided by the ADC to the processor are substantially linearized.

17. The method of claim 16, further comprising providing the first analog signal to a second resistor string comprising a plurality of second scaling and linearizing resistors arranged in series, each succeeding resistor in the second resistor string being scaled differently in accordance with one of a tangent and arc tangent function, the resulting second scaled and linearized voltages provided by the second resistor string being provided as second scaled and linearized input signals to corresponding ones of a plurality of second comparators, each of the second comparators receiving as inputs thereto corresponding second scaled and linearized input signals and the second analog signal or its complement, and providing as outputs therefrom second comparator outputs.

18. The method of claim 17, further comprising providing the second comparator outputs to the ADC and then to the processor to yield at least one digitally interpolated second output signal, wherein each of the at least one interpolated second output signals has a corresponding frequency that is an integer multiple of the first frequency, and outputs provided by the ADC to the processor are substantially linearized.

19. The method of claim 16, wherein pairs of adjoining comparators provide outputs corresponding to one digital bit.

20. The method of claim 16, wherein the first comparators are hysteresis comparators.

21. The method of claim 16, wherein the comparators are zero hysteresis comparators.

22. The method of claim 16, wherein the at least one interpolated first output signal comprises digital pulses having logic high levels separated by logic low levels.

23. The method of claim 16, wherein the first analog signal is a cosine signal.

24. The method of claim 23, wherein the cosine signal is one of a cosine+signal and a cosine−signal.

25. The method of claim 16, wherein the first analog signal is a sine signal.

26. The method of claim 25, wherein the sine signal is one of a sine+signal and a sine−signal.

27. The method of claim 16, wherein the second analog signal is a cosine signal.

28. The method of claim 27, wherein the cosine signal is one of a cosine+signal and a cosine−signal.

29. The method of claim 15, wherein the second analog signal is a sine signal.

30. The method of claim 29, wherein the sine signal is one of a sine+signal and a sine−signal.

31. The method of claim 16, wherein the processor is one of a digital processing block, an arithmetic logic unit ("ALU"), a central processing unit ("CPU"), a microprocessor, a controller, an application specific integrated circuit ("ASIC"), and a computer.

32. The method of claim 16, wherein an interpolation processing circuit comprises the comparators, the scaling resistors, the ADC and the processor.

33. The method of claim 32, wherein the interpolation processing circuit is fabricated using a CMOS process.

34. The method of claim 16, wherein the processor comprises a divider circuit for interpolating the substantially linearized outputs provided by the ADC.

35. The method of claim 34, wherein the substantially linearized outputs are further interpolated in accordance with clock signals provided to or generated by the processor.

36. A circuit for linearizing and subsequently digitally interpolating a sinusoidal analog signal generated by a motion encoder, the sinusoidal analog signal having a first frequency, comprising:

a plurality of comparators configured to receive as inputs thereto the analog signal;

a resistor string comprising a plurality of scaling and linearizing resistors arranged in series, each succeeding resistor in the resistor string being scaled differently in accordance with one of a sine, cosine, arc sine or arc cosine function, positive and negative reference voltages being provided to opposite ends of the resistor string, the resulting scaled and linearized voltages provided by the resistor string being provided as scaled and linearized input signals to corresponding ones of the plurality of comparators, each of the comparators receiving as inputs thereto the analog signal and a corresponding scaled and linearized input signal and providing as outputs therefrom comparator outputs;

an analog-to-digital converter ("ADC") configured to receive the comparator outputs and provide linearized outputs corresponding to each of the comparator outputs therefrom, and a processor configured to receive the linearized outputs from the ADC and to generate at least one digitally interpolated output signal therefrom, wherein each of the at least one interpolated output signals has a corresponding frequency that is an integer multiple of the first frequency.

37. The circuit of claim 36, wherein pairs of adjoining comparators provide outputs corresponding to one digital bit.

38. The circuit of claim 36, wherein the comparators are hysteresis comparators.

39. The circuit of claim 36, wherein the comparators are zero hysteresis comparators.

40. The circuit of claim 36, wherein the at least one interpolated output signal comprises digital pulses having logic high levels separated by logic low levels.

41. The circuit of claim 36, wherein the analog signal is a cosine signal and the resistor string is scaled in accordance with a cosine or arc cosine function.

42. The circuit of claim 41, wherein the cosine signal is one of a cosine+signal and a cosine−signal.

43. The circuit of claim 36, wherein the analog signal is a sine signal and the resistor string is scaled in accordance with a sine or arc sine function.

44. The circuit of claim 43, wherein the sine signal is one of a sine+signal and a sine−signal.

45. The circuit of claim 36, wherein the positive and negative reference voltages correspond approximately and respectively to a positive maximum and a negative minimum of the analog signal.

46. The circuit of claim 36, wherein the processor is one of a digital processing block, an arithmetic logic unit ("ALU"), a central processing unit ("CPU"), a microprocessor, a controller, an application specific integrated circuit ("ASIC"), and a computer.

47. The circuit of claim 36, wherein an interpolation processing circuit comprises the comparators, the scaling resistors, the ADC and the processor.

48. The circuit of claim 47, wherein the interpolation processing circuit is fabricated using a CMOS process.

49. The circuit of claim 36, wherein the processor comprises a divider circuit for interpolating the substantially linearized outputs provided by the ADC.

\* \* \* \* \*